(12) United States Patent
Jiang et al.

(10) Patent No.: US 7,476,277 B2
(45) Date of Patent: **\*Jan. 13, 2009**

(54) APPARATUS FOR IMPROVING STENCIL/SCREEN PRINT QUALITY

(75) Inventors: Tongbi Jiang, Boise, ID (US); Chad A. Cobbley, Boise, ID (US); John VanNortwick, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/701,140

(22) Filed: Nov. 4, 2003

(65) Prior Publication Data

US 2004/0089171 A1 May 13, 2004

Related U.S. Application Data

(62) Division of application No. 09/513,934, filed on Feb. 28, 2000, now Pat. No. 6,641,669, which is a division of application No. 08/935,745, filed on Sep. 23, 1997, now Pat. No. 6,669,781.

(51) Int. Cl.
*B05C 11/00* (2006.01)
(52) U.S. Cl. ...................... 118/504; 427/143
(58) Field of Classification Search ............ 101/128.21, 101/127, 129, 128.4; 427/282, 143, 287, 427/286, 209, 288, 292; 118/504, 301, 505, 118/406, 213
See application file for complete search history.

(56) References Cited

U.S. PATENT DOCUMENTS

| | | | |
|---|---|---|---|
| 3,003,601 A | 10/1961 | Ott | 189/36 |
| 3,008,601 A | 11/1961 | Cahne | |
| 3,357,342 A | 12/1967 | Dreyfus | |
| 3,668,028 A | 6/1972 | Short | 156/3 |
| 4,088,073 A | 5/1978 | Crystal et al. | 101/128.4 |
| 4,269,874 A | 5/1981 | Pryor et al. | 427/282 |
| 4,374,707 A | 2/1983 | Pollack | |
| 4,398,462 A | 8/1983 | Okano | 101/128.21 |
| 4,528,070 A | 7/1985 | Gamblin | 204/11 |

(Continued)

FOREIGN PATENT DOCUMENTS

JP 59-76868 5/1984

OTHER PUBLICATIONS

U.S. Appl. No. 08/935,745 Restriction Requirement mailed Mar. 23, 1999, 6 pgs.

(Continued)

*Primary Examiner*—Brenda A Lamb
(74) *Attorney, Agent, or Firm*—Schwegman, Lundberg & Woessner, P.A.

(57) ABSTRACT

A method and apparatus for improved stencil/screen print quality is disclosed. The stencil or screen assists in application of a printable material onto a substrate, such as an adhesive to a semiconductor die of a semiconductor wafer during a lead-on-chip (LOC) packaging process. In one embodiment, the stencil includes a coating applied to at least one surface of a pattern of the stencil or screen to retard running of the printable material onto the surface. In another embodiment, the stencil or screen includes a second coating applied to at least one other surface of the pattern to promote spreading of the printable material onto the substrate.

20 Claims, 4 Drawing Sheets

U.S. PATENT DOCUMENTS

| | | | |
|---|---|---|---|
| 4,677,905 | A | 7/1987 | Johnson |
| 4,768,427 | A | 9/1988 | Cheng |
| 4,803,110 | A | 2/1989 | Ahn et al. ............... 428/137 |
| 4,862,245 | A | 8/1989 | Pashby et al. ............. 357/70 |
| 5,064,728 | A | 11/1991 | Sunder et al. ............ 428/627 |
| 5,199,347 | A | 4/1993 | Chen |
| 5,240,816 | A | 8/1993 | Noguchi et al. .......... 430/308 |
| 5,447,757 | A | 9/1995 | Cairncross et al. ....... 427/510 |
| 5,460,316 | A | 10/1995 | Hefele ..................... 228/39 |
| 5,478,699 | A | 12/1995 | Blessington et al. ...... 430/308 |
| 5,579,583 | A | 12/1996 | Mehregany et al. ........ 30/342 |
| 5,887,520 | A | 3/1999 | Kinoshita ............. 101/128.4 |
| 6,016,746 | A | 1/2000 | Lake et al. .............. 101/129 |
| 6,060,117 | A | 5/2000 | Pergande et al. ......... 427/224 |
| 6,146,489 | A | 11/2000 | Wirth ..................... 156/280 |
| 6,371,012 | B2 | 4/2002 | Sawyer |

OTHER PUBLICATIONS

U.S. Appl. No. 08/935,745 Final Office Action mailed Jan. 7, 2002, 11 pgs.
U.S. Appl. No. 08/935,745 Non Final Office Action mailed Feb. 28, 2000, 8 pgs.
U.S. Appl. No. 08/935,745 Non Final Office Action mailed Mar. 12, 2003, 11 pgs.
U.S. Appl. No. 08/935,745 Non Final Office Action mailed Apr. 25, 2001, 6 pgs.
U.S. Appl. No. 08/935,745 Non Final Office Action mailed Aug. 2, 1999, 6 pgs.
U.S. Appl. No. 08/935,745 Non Final Office Action mailed Aug. 28, 2002, 10 pgs.
U.S. Appl. No. 08/935,745 Non Final Office Action mailed Sep. 26, 2000, 5 pgs.
U.S. Appl. No. 08/935,745 Notice of Allowance mailed Jul. 29, 2003, 5 pgs.
U.S. Appl. No. 08/935,745 Preliminary Amendment filed Apr. 8, 2002, 8 pgs.
U.S. Appl. No. 08/935,745 Response filed May 26, 2000 to Non Final Office Action mailed Feb. 28, 2000, 12 pgs.
U.S. Appl. No. 08/935,745 Response filed Jul. 14, 2003 to Non Final Office Action mailed Mar. 12, 2003, 13 pgs.
U.S. Appl. No. 08/935,745 Response filed Jul. 25, 2001 to Non Final Office Action mailed Apr. 25, 2001, 11 pgs.
U.S. Appl. No. 08/935,745 Response filed Nov. 2, 1999 to Non Final Office Action mailed Aug. 2, 1999, 9 pgs.
U.S. Appl. No. 08/935,745 Response filed Nov. 26, 2002 to Non Final Office Action mailed Aug. 28, 2002, 7 pgs.
U.S. Appl. No. 08/935,745 Response filed Dec. 21, 2000 to Non Final Office Action mailed Sep. 26, 2000, 3 pgs.
U.S. Appl. No. 09/513,628 Restriction Requirement mailed Oct. 31, 2001, 7 pgs.
U.S. Appl. No. 09/514,916 Final Office Action mailed Nov. 14, 2002, 5 pgs.
U.S. Appl. No. 09/514,916 Non Final Office Action mailed Apr. 24, 2002, 5 pgs.
U.S. Appl. No. 09/514,916 Notice of Allowance mailed Mar. 18, 2003, 9 pgs.
U.S. Appl. No. 09/514,916 Preliminary Amendment filed Feb. 28, 2000, 1 pg.
U.S. Appl. No. 09/514,916 Preliminary Amendment filed May 26, 2000, 6 pgs.
U.S. Appl. No. 09/514,916 Response filed Feb. 14, 2003 to Final Office Action mailed Nov. 14, 2002, 3 pgs.
U.S. Appl. No. 09/514,916 Response filed Jul. 24, 2002 to Non Final Office Action mailed Apr. 24, 2002, 7 pgs.
U.S. Appl. No. 09/513,628 Final Office Action mailed Nov. 13, 2002, 4 pgs.
U.S. Appl. No. 09/513,628 Non Final Office Action mailed Apr. 24, 2002, 5 pgs.
U.S. Appl. No. 09/513,628 Notice of Allowance mailed Mar. 11, 2003, 6 pgs.
U.S. Appl. No. 09/513,628 Preliminary Amendment filed Feb. 28, 2000, 1 pg.
U.S. Appl. No. 09/513,628 Preliminary Amendment filed May 26, 2000, 5 pgs.
U.S. Appl. No. 09/513,628 Response filed Feb. 13, 2003 to Final Office Action mailed Nov. 13, 2002, 3 pgs.
U.S. Appl. No. 09/513,628 Response filed Jul. 24, 2002 to Non Final Office Action mailed Apr. 24, 2002, 4 pgs.
U.S. Appl. No. 09/513,934 Restriction Requirement mailed Oct. 30, 2001, 5 pgs.
U.S. Appl. No. 09/513,934 Non Final Office Action mailed Apr. 24, 2002, 7 pgs.
U.S. Appl. No. 09/513,934 Non Final Office Action mailed Nov. 22, 2002, 6 pgs.
U.S. Appl. No. 09/513,934 Notice of Allowance mailed Jun. 4, 2003, 5 pgs.
U.S. Appl. No. 09/513,934 Preliminary Amendment filed Feb. 28, 2000, 1 pg.
U.S. Appl. No. 09/513,934 Preliminary Amendment filed May 26, 2000, 4 pgs.
U.S. Appl. No. 09/513,934 Response filed Feb. 21, 2003 to Non Final Office Action mailed Nov. 22, 2002, 3 pgs.
U.S. Appl. No. 09/513,934 Response filed Jul. 31, 2002 to Non Final Office Action mailed Apr. 24, 2002, 10 pgs.
U.S. Appl. No. 09/513,935 Non Final Office Action mailed Jun. 20, 2001, 10 pgs.
U.S. Appl. No. 09/513,935 Notice of Allowance mailed Oct. 26, 2001, 8 pgs.
U.S. Appl. No. 09/513,935 Preliminary Amendment filed Feb. 28, 2000, 1 pg.
U.S. Appl. No. 09/513,935 Preliminary Amendment filed May 26, 2000, 4 pgs.
U.S. Appl. No. 09/513,935 Response filed Sep. 20, 2001 to Non Final Office Action mailed Jun. 20, 2001, 9 pgs.
U.S. Appl. No. 09/513,939 Advisory Action mailed Aug. 20, 2001, 5 pgs.
U.S. Appl. No. 09/513,939 Final Office Action mailed May 6, 2002, 10 pgs.
U.S. Appl. No. 09/513,939 Final Office Action mailed Jun. 5, 2001, 11 pgs.
U.S. Appl. No. 09/513,939 Non Final Office Action mailed Jan. 4, 2001, 8 pgs.
U.S. Appl. No. 09/513,939 Non Final Office Action mailed Sep. 28, 2001, 13 pgs.
U.S. Appl. No. 09/513,939 Notice of Allowance mailed Sep. 25, 2002, 5 pgs.
U.S. Appl. No. 09/513,939 Preliminary Amendment filed Feb. 28, 2000, 1 pg.
U.S. Appl. No. 09/513,939 Preliminary Amendment filed May 26, 2000, 4 pgs.
U.S. Appl. No. 09/513,939 Preliminary Amendment filed Sep. 5, 2001, 8 pgs.
U.S. Appl. No. 09/513,939 Response filed Apr. 4, 2001 to Non Final Office Action mailed Jan. 4, 2001, 8 pgs.
U.S. Appl. No. 09/513,939 Response filed Aug. 2, 2001 to Final Office Action mailed Jun. 5, 2001, 7 pgs.
U.S. Appl. No. 09/513,939 Response filed Aug. 6, 2002 to Final Office Action mailed May 6, 2002, 11 pgs.
U.S. Appl. No. 09/513,939 Response filed Dec. 28, 2001 to Non Final Office Action mailed Sep. 28, 2001, 7 pgs.
U.S. Appl. No. 10/630,544 Final Office Action mailed Jun. 25, 2007.
U.S. Appl. No. 10/630,544 Non Final Office Action mailed Apr. 18, 2006, 22 pgs.
U.S. Appl. No. 10/630,544 Non Final Office Action mailed Sep. 30, 2005, 18 pgs.
U.S. Appl. No. 10/630,544 Non Final Office Action mailed Dec. 12, 2006, 23 pgs.
U.S. Appl. No. 10/630,544 Preliminary Amendment filed Jul. 29, 2003, 7 pgs.
U.S. Appl. No. 10/630,544 Response filed Jan. 30, 2006 to Non Final Office Action mailed Sep. 30, 2005, 13 pgs.
U.S. Appl. No. 10/630,544 Response filed Mar. 5, 2007 to Non Final Office Action mailed Dec. 12, 2006, 14 pgs.

U.S. Appl. No. 10/630,544 Response filed Sep. 18, 2006 to Non Final Office Action mailed Apr. 18, 2006, 15 pgs.

U.S. Appl. No. 10/643,567 Final Office Action mailed Apr. 5, 2006, 9 pgs.

U.S. Appl. No. 10/643,567 Final Office Action mailed Apr. 6, 2007, 9 pgs.

U.S. Appl. No. 10/643,567 Non Final Office Action mailed Feb. 3, 2005, 8 pgs.

U.S. Appl. No. 10/643,567 Non Final Office Action mailed Aug. 23, 2005, 9 pgs.

U.S. Appl. No. 10/643,567 Non Final Office Action mailed Oct. 10, 2006, 8 pgs.

U.S. Appl. No. 10/643,567 Response filed Jan. 10, 2007 to Non Final Office Action mailed Oct. 10, 2006, 11 pgs.

U.S. Appl. No. 10/643,567 Response filed Jan. 23, 2006 to Non Final Office Action mailed Aug. 23, 2005, 9 pgs.

U.S. Appl. No. 10/643,567 Response filed Jun. 3, 2005 to Non Final Office Action mailed Feb. 3, 2005, 8 pgs.

U.S. Appl. No. 10/643,567 Response filed Jul. 5, 2006 to Final Office Action mailed Apr. 5, 2006, 13 pgs.

APPARATUS FOR IMPROVING STENCIL/SCREEN PRINT QUALITY

RELATED APPLICATION(S)

This apication is a Divisional of U.S. application Ser. No. 09/513,934 filed on Feb. 28, 2000, now U.S. Pat. No. 6,641,669, which is a Divisional of U.S. application Ser. No. 08/935,745 filed Sep. 23, 1997, now U.S. Pat. No. 6,669,781. These applications are incorporated herein by reference.

FIELD OF THE INVENTION

This invention relates generally to stencil and screen prints, and particularly to improving the quality of such stencil and screen prints.

BACKGROUND OF THE INVENTION

Stencils and screens to apply patterns or printable material on substrates have been used in many contexts. For example, such a patterned adhesive layer, as described in Farnworth et al., U.S. Pat. No. 5,286,697, which is hereby incorporated by reference, may be used to attach a semiconductor die to a lead frame. Farnworth et al. describes the use of a patterned screen to deposit an adhesive layer on the die so that the die can be mounted to the lead frame. The screen is patterned so that the streets between individual dies on a wafer are free from adhesive to permit later sawing of the wafer into separate the dies, and so that the bond pads are also free from adhesive to permit later connection of the bond wires between the lead fingers of the lead frame and the bond pads.

Farnworth et al. specifically teaches a screen printing process in which the patterned screen is situated between the wafer and a liquid adhesive nozzle. Once the screen is properly aligned over the wafer, liquid adhesive is released from the nozzle, coating the wafer with adhesive in the desired pattern. The screen is then removed from the wafer, and the dies of the wafer are attached to a lead frame and separated from one another. The application of liquid adhesive on a wafer using a screen as described in Farnworth et al. is similar to a silk screen process used for printing artwork, such as on T-shirts. This same stencil and screen printing process similar to the silk screen process used for printing artwork on T-shirts has also been utilized in other semiconductor applications. Such semiconductor applications include printing a patterned nonconductive polyimide barrier for flip chips, printing conductive adhesive bumps or solder bumps, and printing conductive ink on flexible printed circuit boards (PCBs).

However, it has been found that a shortcoming to such screen and stencil printings is the migration or overflow of the printable material (such as the adhesive or the ink) underneath the bottom of the screen, which causes the substrate to which the printable material is being applied (such as the wafer or the printed circuit board) to stick to the screen. This results in a poorly patterned layer. More significantly, migration underneath the bottom of the screen shortens screen life, which is defined as the number of consecutive uses, or prints, of the screen without cleaning of the screen. Migration underneath the bottom of the screen forces cleaning of the screen between prints to ensure consecutive clear prints. Reduced screen life therefore slows down the screen and stencil printing process, and adds cost to the process.

SUMMARY OF THE INVENTION

The above-mentioned shortcomings are addressed by the present invention, which will be understood by reading and studying the following specification. The invention describes a stencil and screen used to assist in the application of a patterned printable material layer on a substrate. For example, the stencil or screen may be used to apply an adhesive to a semiconductor die, which is typically a part of a semiconductor wafer. Preferably, the stencil or screen includes a coating applied to at least one surface of a patern to retard migration or overflow of the printable material onto the surface. Alternatively, the stencil or screen includes a second coating applied to at least one other surface of the pattern to promote spreading of the printable material onto the substrate to which it is being applied.

For example, the pattern may include a number of apertures. The side walls of these apertures are side surfaces of the pattern. During the printable material application process, the stencil or screen is aligned over the substrate to which the printable material is to be applied. The bottom surface of the screen or stencil is coated with a material such as polytetrafloroethylene or another polymeric material to retard running of the printable material onto the bottom surface (i.e., between the stencil or screen and the substrate). The top surface and side surfaces of the pattern are alternatively coated with a material such as tungsten to promote spreading of the printable material from the top and side surfaces to the parts of the object surface exposed underneath.

The material coating the bottom surface of the pattern, which is desirably a polymeric material, in accordance with an embodiment of the invention, has three advantageous aspects. First, it acts as a low surface tension layer to minimize printable material migration in order to provide better print definition. Second, it acts as a gasket layer to constrain the flow of the printable material. Third, it acts as a buffer layer to minimize the stencil height inconsistency caused by defects, such as burr, on the bottom of the stencil and the top surface of the substrate onto which the printable material is applied.

A stencil or screen according to an embodiment of the invention therefore increases life of the stencil or screen. That is, consecutive prints can be made using a stencil or screen according to an embodiment of the invention without cleaning. This results in faster screen printing and reduces cost of the printing. Still other and further advantages, aspects and embodiments of the invention will become apparent by reference to the drawings and by reading the following detailed description.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the appended claims.

The invention as it is described in conjunction with FIGS. 1-4, 5(*a*) and 5(*b*) is described in relation to the application of an adhesive layer onto a semiconductor die so that the die may be attached to a lead frame. Those of ordinary skill within the art, however, will appreciate that the invention is not limited to such an application. Any application that may be benefit from improved stencil or screen printing in accordance with the invention is amenable to the invention. For example, the printing of artwork on T-shirts, the printing of patterned non-conductive polyimide barriers for flip chips, the printing of conductive adhesive bumps or solder bumps, and the printing of conductive ink on flexible printed circuit board are also all within the scope of the invention.

As those of ordinary skill within the art will recognize, the terms stencil and screen are generally speaking quite similar to each other. However, the pattern within a given stencil generally has larger apertures than the pattern within a given screen. Furthermore, a screen typically includes an emulsion layer on both the top and bottom surfaces of its pattern. The invention is generally described herein relative to a stencil. However, those of ordinary skill within the art will appreciate that the invention is equally applicable to screens.

Figure 1:
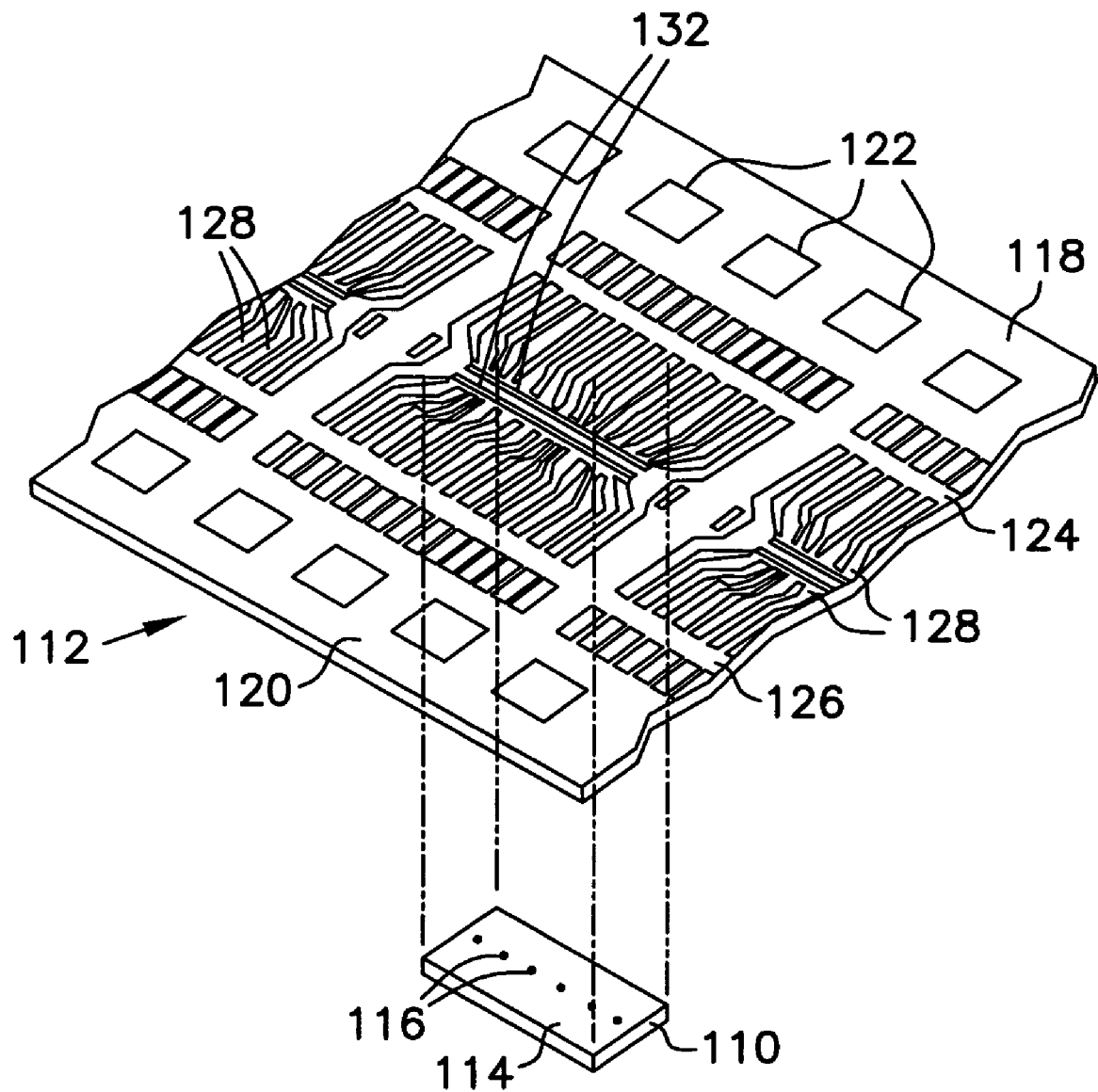
FIG. 1 is a perspective view of a prior art lead frame suitable for use with a lead-on-chip (LOC) die.

Referring first to FIG. 1, a representative prior art lead-on-chip (LOC) die 110 and lead frame 112 are shown. The LOC die 110 is thin, flat and generally rectangular in shape and includes a die face 114, or active side, wherein the integrated circuitry is formed. A plurality of die wire bonding pads 116 are formed across the center and side edges of the die 110 in electrical contact with the integrated circuits formed on the die 110.

The lead frame 112 is formed from metal sheet and includes side rails 118 and 120 formed with indexing holes 122. The indexing holes 122 facilitate transport and indexing of the lead frame 112 by automated packaging machinery. The lead frame 112 also includes side bars 124 and 126 for increased rigidity and to limit the flow of encapsulating material during the encapsulation process. The side rails 118 and 120 and side bars 124 and 126 are trimmed away during a trim and form operation.

Figure 2:
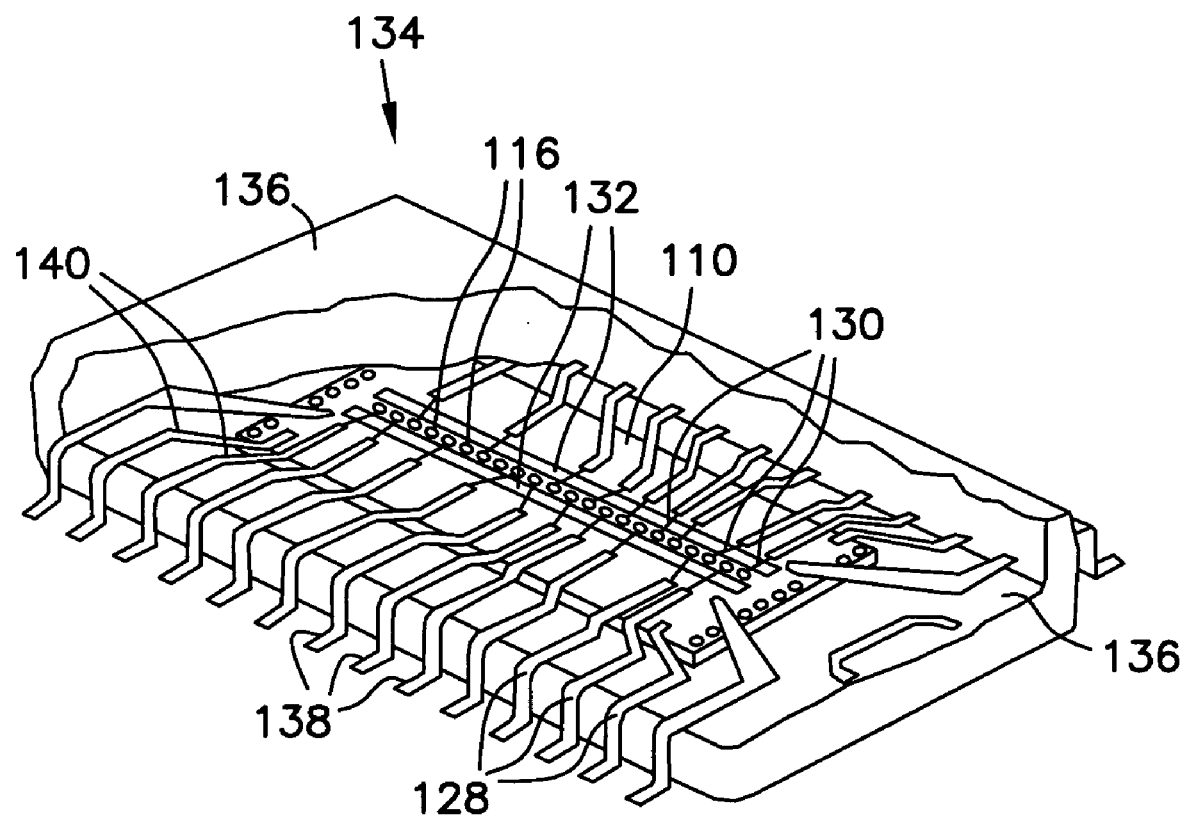
FIG. 2 is a perspective view of a prior art package lead-on-chip (LOC) die.

Furthermore, the lead frame 112 includes a plurality of generally parallel and spaced lead fingers 128. During the packaging process the lead fingers 128 are connected to thin bond wires 130 (as shown in FIG. 2) which also connect to the wire bond pads 116. The lead fingers 128 thus function to electrically connect the integrated circuitry formed on the LOC die 110 to external circuitry (e.g., a printed circuit board). In addition, the lead fingers 128 function to support the LOC die 110 during the packing process and to facilitate heat transfer away from LOC die 110. The lead frame 112 also includes bus bars 132 for making multiple connections to the wire bond pads 116.

Referring next to FIG. 2, the packaged prior art LOC die 110 or semiconductor package 134 is shown. The semiconductor package 134 includes an encapsulating material 136 which encapsulates the chip 110 and all but a terminal portion 138 of the lead fingers 128. Kinks 140 in the lead fingers 128 help to rigidify the assembly. The encapsulating material 136 is typically formed of an insulative plastic material. The LOC die 110 is located in the center of the package 134 with the wire bond pads 116 of the die 110 connected to the thin bond wires 130, which in turn connect to the lead fingers 128.

In addition to being attached to the thin bond wires 130, the lead fingers 128 also attach to the front side 114 of the die 110, or to an alpha barrier (not shown) attached to the die 110. Prior to encapsulation, the lead fingers 128 provide the only physical connection between the lead frame 112 and the LOC die 110. As has been described in the background, a process for attaching the lead fingers 128 to the die 110 is to apply adhesive to the die 110 so that the die can then be affixed to the lead fingers 128. The process by which adhesive is applied to the die 110 so that the lead fingers 128 can be attached thereto is shown by reference to FIG. 3 and FIG. 4.

Figure 3:
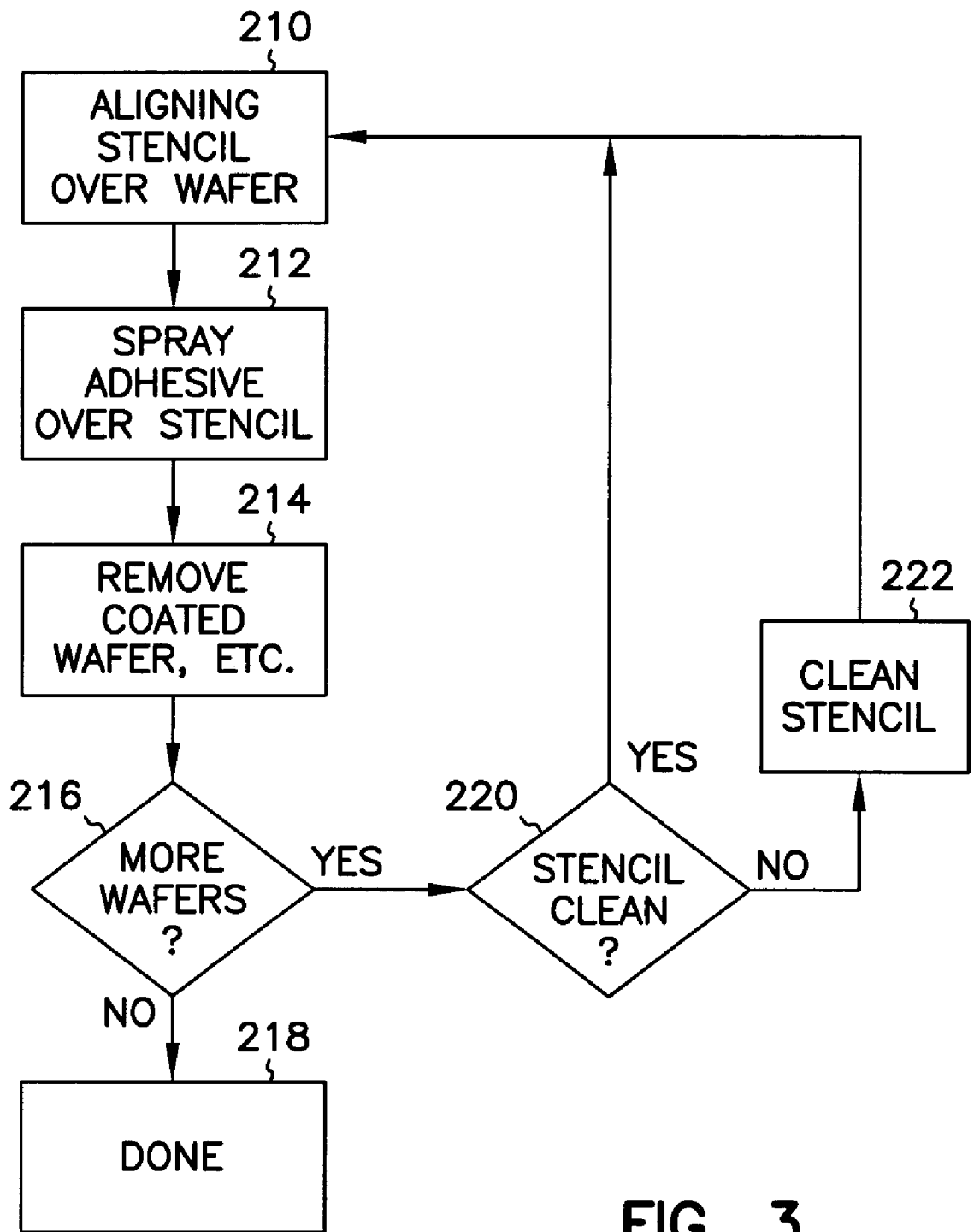
FIG. 3 is a flow chart of a screen printing method for coating a wafer and dies with a patterned adhesive layer using a stencil according to one embodiment of the invention.

Referring first to FIG. 3, a flowchart of a screen printing method for coating a wafer and dies with a patterned adhesive layer using a stencil, according to one embodiment of the invention, is shown. The process of FIG. 3 is a hot screen printing process similar to a silk screening process used for printing artwork. This is an exemplary process by which a stencil according to an embodiment of the invention may be utilized. The invention is not so limited, however, and other processes, such as a cold screen printing, are amenable to application of embodiments of the invention.

In a first step 210 of a hot screen printing process, a stencil is aligned over a wafer, which is one type of substrate onto which printable material may be applied. Other types of substrate include printed circuit boards (PCBs), T-shirts, silk, paper, die, and ceramics; the invention is not limited to any particular type of substrate, however. The wafer is patterned to correspond to a desired adhesive pattern on the wafer. The pattern of the screen is such that the streets between individual dies on the wafer are free from adhesive to permit later sawing of the wafer to separate the dies, and so that the bond pads of the dies are also free from adhesive to permit later connection of the bond wires between the lead fingers of the lead frame and the bond pads.

In step 212, adhesive is sprayed over the stencil. The adhesive is one type of printable material which can be applied to a substrate. Other types of printable material include ink, polymer resins, diluted or soluble polymers, composite materials, and solder paste; the invention is not limited to any particular type of printable material, however. Adhesive flows through the apertures of the stencil, and onto the wafer. The hot screen printing process is preferably performed at an elevated temperature of about 100° C. to about 500° C., to facilitate the flowability of the adhesive.

In step 214, the adhesive-coated wafer is removed from underneath the stencil, and the packaging process as has been already generally described continues with respect to that wafer. The wafer is separated into individual dies, which are then each attached to lead fingers of a lead frame via the adhesive coating on the dies. The dies are ultimately encapsulated in a protective package as has been described in conjunction with FIG. 2. After encapsulation, the resulting integrated circuit chips are tested for proper performance, after which they are ready for inclusion into an electronic device such as a computer.

If there are no more wafers to which adhesive needs to be applied, control proceeds from step 216 to step 218, and the hot screen printing process is finished. Otherwise, the stencil is checked for cleanliness in step 220 by visual inspection. The adhesive, when sprayed over the stencil for application onto the wafer, has a tendency to migrate between the stencil and the wafer, and stick to the underside of the stencil. An advantage of the inventive stencil described herein is that it does not always require cleaning between immediately subsequent uses. Thus, if the stencil is still clean, control proceeds from step 220 back to step 210, where it is aligned over a new wafer, and the hot screen printing process of FIG. 3 starts over. Otherwise, the stencil is first cleaned in step 222 before the process starts over at 210 with respect to a new wafer.

Figure 4:
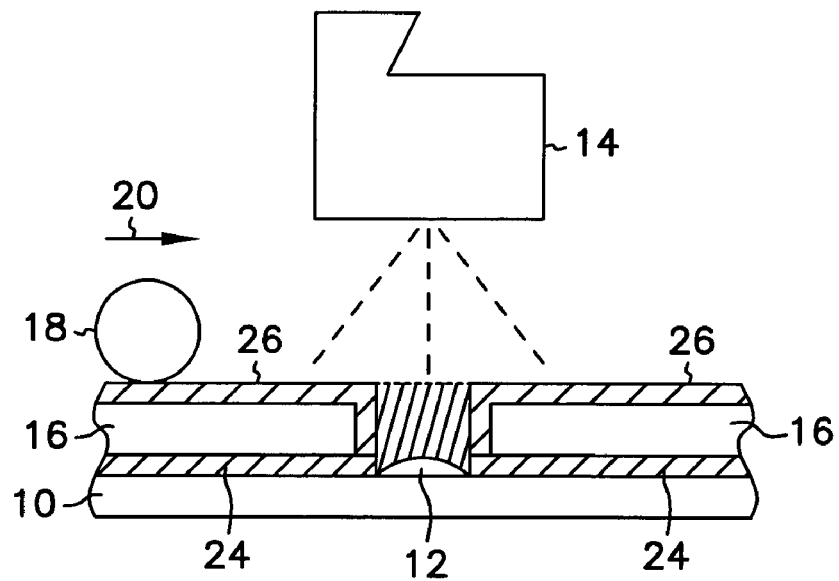
FIG. 4 is a side view of the screen printing method of FIG. 3, illustrating the distinct layers of a stencil according to one embodiment of the invention in detail.

Referring next to FIG. 4, a side view illustrating the screen printing method of FIG. 3 is shown. In a hot screen printing process, semiconductor wafer 10, which usually includes a plurality of semiconductor dies, is coated with a liquid adhesive layer 12 dispensed from a nozzle 14. A stencil 16 having a pattern is situated between the wafer 10 and the nozzle 14 to provide the desired pattern. As shown in FIG. 4, stencil 16 includes apertures corresponding to the desired adhesive layer pattern. Only one aperture is shown for simplicity and clarity of description and illustration. What is referred to as side surfaces of pattern 16 includes, but is not necessarily limited to, the side walls of the apertures.

A dockering roller 18 (or blade), moveably mounted for motion across the stencil 16 as indicated by arrow 20, can be used to aid in the distribution of the adhesive. The adhesive is a suitable thermoplastic or thermoset adhesive. Such suitable thermoplastic adhesive materials include those sold under the trade name Ablestik XR-041395, available from Ablestik, Inc., and which is a polyimide. Such suitable thermoset adhesives include those sold under the trade name Ablestik 8176T, also available from Ablestik, Inc, and which is a phenolic resin.

The pattern of stencil 16 has one or more surfaces modified in accordance to an embodiment of the invention. For example, it has been found that adhesive tends to migrate onto the bottom surface of the pattern, between stencil 16 and wafer 10, during the application process. Therefore, preferably the bottom surface has a coating 24 applied thereto to retard running of the adhesive onto the surface. Furthermore, preferably side surfaces of the pattern (i.e., between which adhesive 12 is deposited), as well as the top surface of the pattern, have a coating (or plating) 26 applied thereto to promote spreading of the adhesive onto the wafer.

The stencil 16 having its surfaces so coated has an extended life, and therefore can be used for consecutive prints without cleaning. Therefore, in an exemplary method of the invention, the stencil is aligned over a first semiconductor wafer, adhesive is sprayed over the stencil to form a patterned adhesive layer on the wafer, and then the stencil is aligned over a second wafer, and adhesive is sprayed a second time over the stencil to form an adhesive layer on the second wafer. The stencil does not require cleaning after the spraying of the adhesive over the stencil when it is aligned over the first wafer, and before the aligning of the stencil over the second wafer.

With respect to a preferred construction of pattern 16, the pattern itself is preferably constructed from metals or metal alloys. One such metal alloy is stainless steel. Stainless steel stencils are commonly available commercially (e.g., from Photo Stencil, Inc., of Colorado Springs, Colo., and from UTZ Engineering, Inc., of Clifton, N.J.). Stainless steel stencils in particular have a surface tension of 1384 dyne/cm at melting point.

Coating 24 is applied underneath the bottom surface of pattern 16 to retard running of the adhesive onto the bottom surface. Preferably, coating 24 has a surface tension less than the surface tension of pattern 16. One such coating is polytetrafloroethylene, which is a polymeric material available under the trade name DuPont Teflon, available from DuPont, Inc. Polytetrafloroethylene has a critical surface tension of 23.9 dyne/cm at room temperature. Other polymers may also be used since surface tension of most polymers is one order less than that of metals or ceramics. Because its surface tension is markedly less than that of pattern 16, the running property of the adhesive onto the bottom surface of pattern 16 is controlled. Pattern 16 is initially constructed from a metal or metal alloy having a high surface tension to spread the adhesive onto the wafer.

Furthermore, to promote the spreading of the adhesive on the semiconductor wafer, plating 26 is applied to at least the side surfaces or the top surface of pattern 16. As shown in FIG. 4, plating 26 is applied to both the top surface and the side surfaces of pattern 16. Plating 26 is a coating having a surface tension greater than the surface tension of pattern 16. One such plating is tungsten, which has a surface tension of 2500 dyne/cm at melting point. Other platings having similarly high surface tensions include tungsten carbide, and tungsten nitride. Still other platings having high surface tensions include nickel and nickel alloy. Because the surface tension of plating 26 is greater than that of pattern 16, the spreading of the adhesive onto the semiconductor wafer is promoted.

Those skilled within the art will recognize that the embodiment shown in FIG. 4 is only a preferred embodiment of the invention. Other embodiments conforming to the basic principles of the invention are also contemplated. For example, a stencil having a pattern with a coating on the bottom surface of the pattern to retard running of adhesive onto the surface, but not necessarily having a plating or second coating on the top or side surfaces of the pattern to promote spreading of the adhesive onto the semiconductor die, is within the scope of the invention. For further example, a stencil having a pattern with a plating or coating on at least either the top or side surfaces of the pattern to promote spreading of adhesive onto the die, but without a coating on the bottom surface of the pattern to retard running of the adhesive onto the bottom surface, is also within the scope of the invention.

As has been described, preferably coating 24 has a surface tension less than that of pattern 16, and plating 26 has a surface tension greater than that of pattern 16. This permits the coating to retard running of the adhesive, and the plating to promote spreading of the adhesive onto the semiconductor wafer. The reason why the coating and the plating perform these functions in the preferred embodiment is shown by reference to FIG. 5(a) and FIG. 5(b). Coating 24, plating 26 as applied to the top surface of the pattern, and pattern 16, can be referred to as separate layers of the semiconductor die stencil shown in FIG. 4.

Figure 5A:
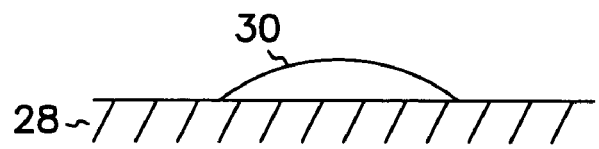
FIG. 5(a) is a side view showing adhesive applied to a surface of a stencil according to one embodiment of the invention having a high surface tension; and, FIG. 5(*b*) is a side view showing adhesive applied to a surface of a stencil according to one embodiment of the invention having a low surface tension.
Figure 5B:
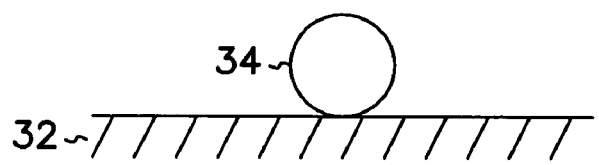

Referring first to FIG. 5(a), surface 28 is a surface having a high surface tension, such as that of plating 26 of FIG. 4. Because the surface tension is high, surface 28 tends to pull adhesive 30 across the entire surface. The greater the surface tension, the more the adhesive 30 is spread across surface 28. Therefore, while pattern 16 of FIG. 4 preferably has a sufficient high surface tension (1384 dyne/cm) to spread the adhesive, the addition of plating 26, which has an even greater surface tension (2500 dyne/cm), promotes the spreading of the adhesive even more.

Referring next to FIG. 5(*b*), surface 32 is a surface having a low surface tension, such as that of coating 24 of FIG. 4. Because the surface tension is low, surface 32 does not tend to pull adhesive 34 across the entire surface. The adhesive remains where it first is located, and does not migrate or run across the surface. The lower the surface tension, the less the adhesive 34 tends to be pulled across surface 32. Thus, because preferably coating 24 of FIG. 4 has a much lower surface tension than pattern 16 (23.9 dyne/cm compared to 1384 dyne/cm), when the adhesive reaches an edge of coating 24, coating 24 retards the adhesive from running or migrating any further.

A surface-modified stencil has been described. Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the present invention. Furthermore, while the invention has been described specifically in the context of the application of adhesive to a semiconductor die, the invention is not limited to such an end use, and the invention is amenable to other semiconductor and non-semiconductor uses as well. Therefore, it is manifestly intended that this invention be limited only by the following claims and equivalents thereof.

We claim:

1. A stencil comprising:
    a stencil pattern having at least one stencilling opening formed therein:
    a first coating applied to one surface of the stencil pattern and one or more side surfaces of the stencilling openings and having a surface tension greater than the surface tension of the stencil pattern; and
    a second coating applied to the opposite surface of the stencil pattern and having a surface tension less than the surface tension of the stencil pattern.

2. The stencil of claim 1, wherein the stencil pattern is stainless steel.

3. The stencil of claim 1, wherein the first coating is selected from the group comprising tungsten, tungsten carbide, tungsten nitride, nickel and nickel alloys.

4. The stencil of claim 1, wherein the second coating is a polymeric material.

5. The stencil of claim 1, wherein the stencilling opening corresponds to an adhesive pattern for an integrated circuit die.

6. The stencil of claim 1, wherein the second coating includes polytetrafloroethylene.

7. The stencil of claim 1, wherein the second coating includes a surface tension at least one order of magnitude less than surface tension of a metal.

8. The stencil of claim 1, wherein the second coating is to control a running property of an adhesive applied to the coated stencil.

9. The stencil of claim 8, wherein the stencilling opening receives the adhesive.

10. The stencil of claim 1, wherein the first coating includes tungsten.

11. The stencil of claim 10, wherein the first coating includes a nitride of tungsten.

12. The stencil of claim 1, wherein the surface tension of the stencil pattern includes a surface tension of 1384 dyne/cm at melting point.

13. The stencil of claim 1, wherein the first coating and the second coating are configured to control a running property of an adhesive applied onto the coated stencil.

14. A process for manufacturing a stencil for assisting in the application of a printable material comprising:
    forming a stencil pattern from a sheet of material impervious to the printable material and forming at least one stencilling opening therein;
    coating a top surface of the stencil pattern with a first coating having a surface tension greater than the surface tension of the stencil pattern;
    coating one or more side surfaces of the stencilling openings with the first coating having a surface tension greater than the surface tension of the stencil pattern; and
    coating the bottom surface of the stencil pattern with a second coating having a surface tension less than the surface tension of the stencil pattern.

15. The process of claim 14, wherein application of the printable material includes using a dockering tool to assist in spreading the printable material across the coated top surface of the stencil pattern and through the coated stencilling openings.

16. A stencil comprising:
    a metal stencil pattern including at least one stencilling opening formed therein, the stencil pattern includes a surface tension;
    a first coating applied to one surface of the stencil pattern and one or more side surfaces of the stencilling openings, the first coating is selected from the group comprising tungsten, tungsten carbide, tungsten nitride, nickel and nickel alloys, the first coating includes a surface tension greater than the surface tension of the stencil pattern; and
    a polymeric second coating applied to the opposite surface of the stencil pattern and having a surface tension less than the surface tension of the stencil pattern.

17. The stencil of claim 16, wherein the second coating includes polytetrafloroethylene.

18. The stencil of claim 16, wherein the second coating includes a surface tension at least one order of magnitude less than surface tension of a metal.

19. The stencil of claim 16, wherein the first coating includes tungsten.

20. The stencil of claim 16, wherein the stencil pattern includes stainless steel.

\* \* \* \* \*

UNITED STATES PATENT AND TRADEMARK OFFICE
CERTIFICATE OF CORRECTION

PATENT NO.        : 7,476,277 B2
APPLICATION NO. : 10/701140
DATED             : January 13, 2009
INVENTOR(S)      : Jiang et al.

It is certified that error appears in the above-identified patent and that said Letters Patent is hereby corrected as shown below:

In column 1, line 6, delete "apication" and insert -- application --, therefor.

In column 7, line 52, in Claim 6, delete "polytetrafloroethylene" and insert -- polytetrafluoroethylene --, therefor.

In column 8, line 49, in Claim 17, delete "polytetrafloroethylene" and insert -- polytetrafluoroethylene --, therefor.

Signed and Sealed this

Thirty-first Day of March, 2009

JOHN DOLL
*Acting Director of the United States Patent and Trademark Office*